United States Patent
Beck et al.

(10) Patent No.: US 6,667,094 B1
(45) Date of Patent: Dec. 23, 2003

(54) PASTE FOR SCREENPRINTING ELECTRIC STRUCTURES ONTO CARRIER SUBSTRATES

(75) Inventors: Walter Beck, Uttenweiler (DE); Joachim Hennig, Reutlingen (DE); Klaus Krüger, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/806,387

(22) PCT Filed: Jul. 1, 2000

(86) PCT No.: PCT/DE00/02151

§ 371 (c)(1),
(2), (4) Date: Jun. 16, 2001

(87) PCT Pub. No.: WO01/09060

PCT Pub. Date: Feb. 8, 2001

(30) Foreign Application Priority Data

Jul. 29, 1999 (DE) .......................................... 199 35 677

(51) Int. Cl.[7] .......................... B32B 18/00; B32B 3/00; C03C 13/00; C04B 14/38
(52) U.S. Cl. ...................... 428/210; 428/195; 428/689; 428/697; 428/698; 501/35; 501/37; 106/287.17; 106/287.18; 106/711
(58) Field of Search ..................... 501/35, 37; 428/195, 428/201, 210, 689, 697, 698; 106/711, 287.1, 287.17, 287.18, 287.23, 311

(56) References Cited

U.S. PATENT DOCUMENTS

| | | | | | |
|---|---|---|---|---|---|
| 3,878,443 | A | * | 4/1975 | Girard et al. | 317/258 |
| 4,424,251 | A | * | 1/1984 | Sugishita et al. | 428/209 |
| 5,387,474 | A | * | 2/1995 | Mikeska et al. | 428/688 |
| 5,585,312 | A | * | 12/1996 | TenEyck et al. | 501/35 |
| 6,124,769 | A | * | 9/2000 | Igarashi et al. | 333/172 |

OTHER PUBLICATIONS

Chemical Abstracts, Jul. 9, 1990, vol. 113, No. 2.

Patent Abstracts of Japan, Feb. 28, 1997, vol. 1997, No. 2.

* cited by examiner

Primary Examiner—Deborah Jones
Assistant Examiner—G. Blackwell-Rudasill
(74) Attorney, Agent, or Firm—Kenyon & Kenyon

(57) ABSTRACT

A paste for screen printing of electrical structures on substrates, in particular ceramic substrates, which includes a mixture of inorganic solid particles having high sintering temperature and an inorganic binding agent having a low sintering temperature below the sintering temperature of the inorganic solid particles, wherein the inorganic solid particles having high sintering temperature are at least partially in the form of fibers. The strength and breaking reliability of the printed and then fired electrical structures, such as resistors and coating layers, may be increased by the fiber components in the printing paste.

21 Claims, No Drawings

PASTE FOR SCREENPRINTING ELECTRIC STRUCTURES ONTO CARRIER SUBSTRATES

BACKGROUND INFORMATION

Pastes are used in thick film technology in order to produce electrical components, such as resistors, capacitor layers, and insulating glass layers between printed conductor structures, as well as coating or protective layers which isolate a circuit applied to a ceramic substrate from the surrounding environment, on ceramic substrates. The composition of known thick film pastes is described, for example, in "Herbert Reichl; Hybridintegration: Technologie u. Entwurf von Dickschichtschaltungen [Hybrid Integration: Technology and Design of Thick Film Circuits]; Huthig Verlag, Heidelberg, 1988, pages 37 to 63". Thick film pastes are printed on a ceramic substrate in the screen printing method. Known pastes contain a mixture of small solid particles having a high softening point or high sintering temperature and an inorganic binding agent, for example a glass having a low sintering temperature, which are dispersed in a vaporizable organic binding agent. The solid particles typically have a diameter of around 0.1 to p3 $\mu$m. The dispersions have the consistency of a paste and have a rheology which makes the paste suitable for screen printing. Organic binding agents contain different additives such as binding and Theological agents, which increase the printability of the paste. For printing resistors, metal oxides, which determine the resistor's conductivity, are also added to the paste. After screen printing, the printed structures are fired in a sintering process, the organic components being completely evaporated out of the paste or pyrolized. At a temperature below the sintering temperature of the solid particles,but above the sintering temperature of the inorganic binding agent, the latter is softened and flows around the non-sintering solid particles. Finished electrical structures have a thermal expansion behavior after cooling that is different from that of the substrate. Therefore crack formation occurs frequently in resistor structures in the case of temperature variations, whereby the electrical properties are disadvantageously influenced. In the extreme case the resistor completely fails. Cracks in a printed coating layer or insulation layer lead to a disadvantageous penetration of harmful substances or a short circuit of the printed conductors.

SUMMARY OF THE INVENTION

With the paste according to the present invention for screen printing of electrical structures on ceramic substrates, the tensile strength of printed structures is increased by a factor of ten and the danger of crack formation or fracture of the structures is reduced. The probability of failure of the circuit created on the substrate can clearly be reduced hereby, which is particularly significant in those cases in which the substrate is subjected to very high temperature change stresses or strong accelerating forces in operation, as is the case, for example, in motor vehicle electronic devices. The fracture toughness and strength of the structures is increased by fibers, which form the high-sintering solid portion of the screen printing paste. The fibers embedded in the fired structures (resistors or insulating layers) in this case increase the strength of the structures formed. The fibers are made out of a material which does not sinter at the sintering temperature of the inorganic binding agent. For example, ceramic fibers or HT glass fibers having a high softening point, or high sintering temperature, may be used here. Preferably the length of the fibers amounts to at least five times their diameter. The fiber-containing paste has good printability in the screen printing process, so that structures can be applied to the substrate with the known screen printing method.

DETAILED DESCRIPTION

Embodiments of the present invention are explained in the following detailed description. Pastes used for the screen printing of electrical structures on a substrate include at least the following components:

a) inorganic fiber particles having a high sintering temperature, b) inorganic binding agent, and c) vaporizable organic binding agent.

The inorganic fiber particles contained in the paste have a sintering temperature which is clearly above the sintering temperature of the inorganic binding agent and do not sinter during the firing process. Materials which may be used for this are fibers made of ceramic solids or HT glasses having a high softening point. For example, fibers of $BaTiO_3$, $CaTiO_3$, $SrTiO_3$, $PbTiO_3$, $CaZrO_3$, $BaZrO_3$, $CaSnO_3$, $BaSnO_3$, a metal carbide or a metal nitride, zirconium dioxide, or silicon dioxide. Quartz glass, borosilicate glass, aluminum silicate glass, silicon glass, and other glasses may be used as HT glasses. In a preferred embodiment the fibers are made out of $Al_2O_3$ ceramic. Fibers of this kind are sold commercially, for example for use in cutting tools. The fiber diameter should be between 3 and 10 microns, and the length of the fibers between 15 and 100 microns. The length of the fibers should exceed the diameter by a factor of 5. Good results were obtained having fibers, the length of which is five to ten times the diameter. The filling factor of the fibers in the screen printing paste should be around 2 to 10 percent by volume. The paste can possibly include other high-sintering, non fibrous ceramic particles, or HT glass particles of a different geometry.

Known glasses are used as inorganic binding agents, whose sintering temperature is clearly below the sintering temperature of the fibers and which undergo a viscous phase sintering at the time of firing the printed structures. The particle size is between 0.5 and 20 microns. Amorphous vitrifiable or amorphous crystallizable glasses, as are used typically as inorganic binding agents in thick film pastes, may be used.

The organic binding agents include the printing substrate and different additives, such as softeners, for example glycerin, and solvents, for example ethyl cellulose or terpineol. Polymer binding agents for thick film pastes known heretofore may be used.

A screen having a web width and opening diameter of around 20 to 120 microns is used for screen printing the paste. Naturally, printing templates also can be used. A ceramic substrate, for example made out of $Al_2O_3$ ceramic, or a multilayer substrate, is used as the substrate.

Conducting agents are added to the paste indicated above for screen printing of resistors on the substrate. For example, lead ruthenate $Pb_2Ru_2O_6$ may be used for this purpose, but also other conducting agent additives may be used, such as, for example, admixtures of ruthenium dioxide or iridium oxide/platinum, and palladium oxide/silver.

The structures are printed on the ceramic substrate in a thickness of 5 to 50 microns, dried, and then fired in a sintering oven. At temperatures of 400 to 600° C. the organic components evaporate out of the paste or pyrolize. At temperatures between 750 and 1000° C. the inorganic binding agent begins to soften and sinters, whereby the non-sintering fiber particles having a softening point clearly above 1000° C. are more tightly arranged.

Different electrical structures can be printed onto the substrate with the screen printing paste composition indicated above. Thus, for example, coating layers can be applied to the top side of the ceramic substrate. It is also possible to print insulating layers onto printed conductors, which then are covered with further printed conductors. Resistor elements can be printed by using special additives, such as for example the conducting agent additives mentioned above. Furthermore, by using special paste additives, it is possible to print capacitor layers on the substrate with the paste presented here. The percentage by volume of the fibers in the fired structures is between 6 and 20% after cooling. The fibers contained in the fired structures form a kind of internal framework, by means of which the strength of the structures is increased.

What is claimed is:

1. A paste for screen printing electrical structures onto ceramic substrates, comprising:
   a vaporizable organic binding agent;
   a mixture, dispersed in the organic binding agent, of inorganic solid particles having a first sintering temperature and an inorganic binding agent having a second sintering temperature, the second sintering temperature being lower than the first sintering temperature, the inorganic solid particles at least partially being in the forms of fibers.
2. The paste according to claim 1, wherein a length of the fibers exceeds a diameter of the fibers by a factor of at least five.
3. The paste according to claim 1, wherein the fibers are ceramic fibers.
4. The paste according to claim 3, wherein the ceramic fibers are composed of $Al_2O_3$ ceramic.
5. The paste according to claim 1, wherein the fibers are glass fibers composed of a high-sintering glass having a softening point above the second sintering temperature.
6. The paste according to claim 5, wherein the glass fibers are composed of at least one of borosilicate glass, aluminum silicate glass and silicon glass.
7. The paste according to claim 1, further comprising high-sintering non-fibrous ceramic particles.
8. The paste according to claim 1, wherein a percentage by volume of the fibers in the paste is between 2 and 10 percent.
9. The paste according to claim 1, further comprising conducting agent additives.
10. The paste according to claim 9, wherein the conducting agent additives include a metal oxide.
11. A device comprising:
    a substrate; and
    electrical structures situated on the substrate, the electrical structures being formed by screen printing on the substrate with a paste and by subsequent sintering,
    wherein the electrical structures form electrical resistors, and
    wherein the paste includes:
    a vaporizable organic binding agent, and
    a mixture, dispersed in the organic binding agent, of inorganic solid particles having a first sintering temperature and an inorganic binding agent having a second sintering temperature, the second sintering temperature being lower than the first sintering temperature, the inorganic solid particles at least partially being in the form of fibers.
12. A device comprising:
    a substrate; and
    electrical structures situated on the substrate, the electrical structures being formed by screen printing on the substrate with a paste and by subsequent sintering,
    wherein the electrical structures form at least one of covering layers and insulating layers, and
    wherein the paste includes:
    a vaporizable organic binding agent, and
    a mixture, dispersed in the organic binding agent, of inorganic solid particles having a first sintering temperature and an inorganic binding agent having a second sintering temperature, the second sintering temperature being lower than the first sintering temperature, the inorganic solid particles at least partially being in the form of fibers.
13. The paste according to claim 1, wherein the fibers do not sinter at a sintering temperature of the inorganic binding agent.
14. The paste according to claim 1, wherein the fibers include at least one of BaTiO3, CaTiO3, SrTiO3, PbTiO3, CaZrO3, BaZrO3, CaSnO3, BaSnO3, a metal carbide, a metal nitride, zirconium dioxide, and silicon dioxide.
15. The paste according to claim 1, wherein a diameter of each of the fibers is between 3 and 10 microns, and a length of each of the fibers is between 15 and 100 microns.
16. The paste according to claim 1, wherein a particle size of the inorganic binding agent is between 0.5 and 20 microns.
17. The paste according to claim 1, wherein the organic binding agent includes softeners.
18. The paste according to claim 17, wherein the softeners include at least one of glycerin, ethyl cellulose, and terpineol.
19. A device comprising:
    a substrate; and
    an electrical structure situated on the substrate, and being formed by screen printing on the substrate with a paste and by subsequent sintering, wherein the paste includes a vaporizable organic binding agent, and a mixture, dispersed in the organic binding agent, of inorganic solid particles having a first sintering temperature and an inorganic binding agent having a second sintering temperature that is lower than the first sintering temperature, the inorganic solid particles at least partially being in the form of fibers;
    wherein the electrical structure at least partially includes fibers.
20. The device according to claim 19, wherein the electrical structure includes an electrical resistor.
21. The device according to claim 19, wherein the electrical structure forms at least one of a covering layer and an insulating layer.

* * * * *

UNITED STATES PATENT AND TRADEMARK OFFICE
CERTIFICATE OF CORRECTION

PATENT NO. : 6,667,094 B1
DATED : December 23, 2003
INVENTOR(S) : Walter Beck et al.

It is certified that error appears in the above-identified patent and that said Letters Patent is hereby corrected as shown below:

Column 1,
Line 28, change "Theological" to -- rheological --

Signed and Sealed this

Seventeenth Day of August, 2004

JON W. DUDAS
*Acting Director of the United States Patent and Trademark Office*